United States Patent
Lim et al.

(10) Patent No.: US 11,309,526 B2
(45) Date of Patent: Apr. 19, 2022

(54) DISPLAY APPARATUS HAVING A LIGHT-EMITTING DEVICE

(71) Applicant: LG Display Co., Ltd., Seoul (KR)

(72) Inventors: Jung-Shik Lim, Paju-si (KR); Sun-Man Kim, Seoul (KR); Min-Gyu Lee, Daegu (KR)

(73) Assignee: LG DISPLAY CO., LTD., Seoul (KR)

( * ) Notice: Subject to any disclaimer, the term of this patent is extended or adjusted under 35 U.S.C. 154(b) by 20 days.

(21) Appl. No.: 16/593,031

(22) Filed: Oct. 4, 2019

(65) Prior Publication Data
US 2020/0119311 A1  Apr. 16, 2020

(30) Foreign Application Priority Data
Oct. 16, 2018 (KR) .................. 10-2018-0123316

(51) Int. Cl.
*H01L 51/52* (2006.01)
*H01L 27/32* (2006.01)

(52) U.S. Cl.
CPC ........ *H01L 51/5275* (2013.01); *H01L 27/322* (2013.01); *H01L 27/3272* (2013.01)

(58) Field of Classification Search
CPC ............ H01L 51/5256; H01L 51/5265; H01L 51/5281; H01L 27/3258; H01L 51/5275
See application file for complete search history.

(56) References Cited

U.S. PATENT DOCUMENTS

| | | | |
|---|---|---|---|
| 2006/0049419 | A1 | 3/2006 | Tanaka |
| 2012/0097957 | A1 | 4/2012 | Kim |
| 2012/0098008 | A1* | 4/2012 | Song ................... H01L 27/3258 257/98 |
| 2016/0218161 | A1* | 7/2016 | Li ....................... H01L 27/3241 |
| 2017/0084676 | A1* | 3/2017 | Jang ................... H01L 51/5275 |
| 2018/0174508 | A1 | 6/2018 | Jeong et al. |

FOREIGN PATENT DOCUMENTS

| | | |
|---|---|---|
| CN | 101764146 A | 6/2010 |
| CN | 103325811 A | 9/2013 |
| CN | 104576706 A | 4/2015 |
| CN | 106784362 A | 5/2017 |
| EP | 3 261 148 A1 | 12/2017 |

* cited by examiner

*Primary Examiner* — Raj R Gupta
(74) *Attorney, Agent, or Firm* — Birch, Stewart, Kolasch & Birch, LLP

(57) ABSTRACT

A display device having a light-emitting device is provided. The display device can include a buffer insulating layer disposed on a path of light emitted from the light-emitting device. The buffer insulating layer can have a stacked structure of a first buffer insulating layer having the refractive index which decreases in a direction away from the light-emitting device, and a second buffer insulating layer having the refractive index which increases in a direction away from the light-emitting device. Thus, in the display device, the unintended constructive and destructive interference of the light emitted from the light-emitting device can be prevented. Therefore, in the display device, the luminous efficacy can be increased, and the variation of color coordinates can be prevented.

18 Claims, 5 Drawing Sheets

DISPLAY APPARATUS HAVING A LIGHT-EMITTING DEVICE

CROSS-REFERENCE TO RELATED APPLICATION

This application claims the priority benefit of Korean Patent Application No. 10-2018-0123316, filed in the Republic of Korea on Oct. 16, 2018, which is hereby incorporated by reference as if fully set forth herein into the present application.

BACKGROUND OF THE INVENTION

Field of the Invention

The present invention relates to a display apparatus including insulating layers which are disposed on a path of light generated by a light-emitting device.

Discussion of the Related Art

Generally, an electronic appliance, such as a monitor, a TV, a laptop computer and a digital camera, includes a display apparatus to produce an image. For example, the display apparatus can include a light-emitting device which emits light to display a specific color, and a thin film transistor for controlling the light-emitting device.

The thin film transistor and the light-emitting device can be formed on a device substrate. The device substrate can support the thin film transistor and the light-emitting device. The device substrate can include a transparent material. For example, the light emitted from the light-emitting device can emit outside through the device substrate.

A buffer insulating layer can be disposed between the device substrate and the thin film transistor, and between the device substrate and the light-emitting device. The buffer insulating layer can prevent the quality deterioration due to the device substrate in the process of forming the light-emitting device.

However, in the display apparatus, the light emitted from the light-emitting device can be reflected by the difference of the refractive index between the device substrate and the buffer insulating layer, and/or the difference of the refractive index of layers or elements between the device substrate and the light-emitting device, unintentionally. The light unintentionally reflected between the device substrate and the light-emitting device can be re-reflected by an electrode of the light-emitting device and/or an electrode of the thin film transistor. The light re-reflected by the electrode of the light-emitting device and/or the electrode of the thin film transistor can occur the constructive and/or destructive interference with the light which is not reflected between the device substrate and the light-emitting device. Thus, in the display apparatus, luminance can be decreased or color coordinates can be changed.

SUMMARY OF THE INVENTION

Accordingly, the present invention is directed to a display apparatus that substantially obviates one or more problems due to limitations and disadvantages of the related art.

An object of the present invention is to provide a display apparatus capable of preventing any unintended constructive and destructive interference of the light.

Another object of the present invention is to provide a display apparatus capable of preventing an unintended reflection at the interface between insulating layers which are disposed on the path of the light emitted from the light-emitting device.

Additional advantages, objects, and features of the invention will be set forth in part in the description which follows and in part will become apparent to those having ordinary skill in the art upon examination of the following or can be learned from practice of the invention. The objectives and other advantages of the invention can be realized and attained by the structure particularly pointed out in the written description and claims hereof as well as the appended drawings.

To achieve these objects and other advantages and in accordance with the purpose of the invention, as embodied and broadly described herein, there is provided a display apparatus including a first buffer insulating layer on a device substrate. A second buffer insulating layer is disposed on the first buffer insulating layer. A light-emitting device is disposed on the second buffer insulating layer. The refractive index of the first buffer insulating layer and the refractive index of the second buffer insulating layer decrease in a direction away from an interface between the first buffer insulating layer and the second buffer insulating layer.

A color filter can be disposed between the second buffer insulating layer and the light-emitting device.

The first buffer insulating layer can include a first lowest buffer layer disposed close to the device substrate, a first highest buffer layer disposed close to the second buffer insulating layer, and a first intermediate buffer layer between the first lowest buffer layer and the first highest buffer layer. The refractive index of the first intermediate buffer layer can be between the refractive index of the first lowest buffer layer and the refractive index of the first highest buffer layer.

The refractive index of the first lowest buffer layer can be larger than the refractive index of the device substrate.

The second buffer insulating layer can include a second lowest buffer layer disposed close to the first buffer insulating layer. The refractive index of the second lowest buffer layer can be smaller than the refractive index of the first highest buffer layer.

The refractive index of the second lowest buffer layer can be the same as the refractive index of the first intermediate buffer layer.

The second buffer insulating layer can further include a second highest buffer layer disposed close to the light-emitting device, and a second intermediate buffer layer between the second lowest buffer layer and the second highest buffer layer. The refractive index of the second intermediate buffer layer can be between the refractive index of the second lowest buffer layer and the refractive index of the second highest buffer layer.

The refractive index of the second intermediate buffer layer can be the same as the refractive index of the first lowest buffer layer.

The refractive index of the second highest buffer layer can be the same as the refractive index of the device substrate.

The thickness of the second highest buffer layer can be larger than the thickness of the second intermediate buffer layer.

In another embodiment, the display apparatus include a light-emitting device. The light-emitting device includes a light-emitting layer between a first electrode and a second electrode. A buffer insulating layer is disposed on the first electrode of the light-emitting device. The buffer insulating layer has a stacked structure of a first buffer insulating layer having the refractive index which decreases in a direction away from the light-emitting device, and a second buffer insulating layer having the refractive index which increases in a direction away from the light-emitting device.

The second buffer insulating layer can be disposed between the light-emitting device and the first buffer insulating layer.

The first buffer insulating layer can have a stacked structure of first buffer layers. The second buffer insulating layer can have a stacked structure of second buffer layers. The number of the stacked second buffer layers can be the same as the number of the stacked first buffer layers.

The first buffer layers can have the same thickness.

The variation of the refractive index between the second buffer layers can symmetrical with the variation of the refractive index between the first buffer layers.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Figure 1:
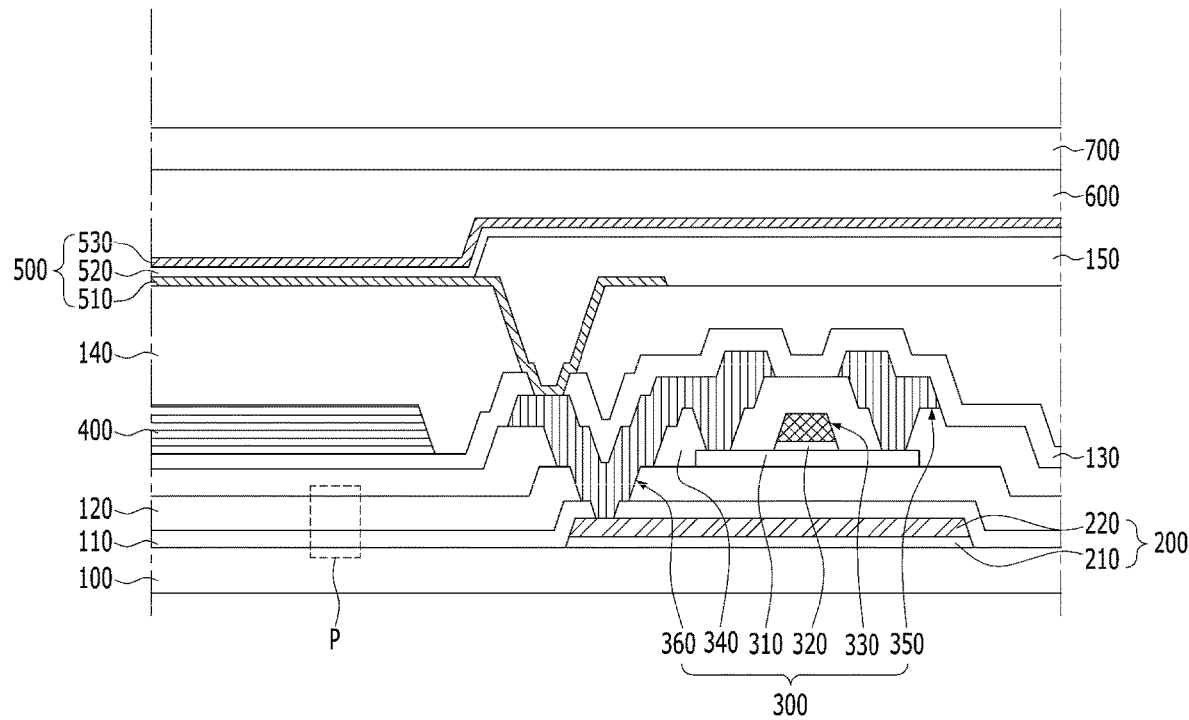
FIG. 1 is a view schematically showing a display apparatus according to an embodiment of the present invention.

Hereinafter, details related to the above objects, technical configurations, and operational effects of the embodiments of the present invention will be clearly understood by the following detailed description with reference to the drawings, which illustrate some embodiments of the present invention. Here, the embodiments of the present invention are provided in order to allow the technical sprit of the present invention to be satisfactorily transferred to those skilled in the art, and thus the present invention can be embodied in other forms and is not limited to the embodiments described below.

In addition, the same or extremely similar elements can be designated by the same reference numerals throughout the specification, and in the drawings, the lengths and thickness of layers and regions can be exaggerated for convenience. It will be understood that, when a first element is referred to as being "on" a second element, although the first element can be disposed on the second element so as to come into contact with the second element, a third element can be interposed between the first element and the second element.

Here, terms such as, for example, "first" and "second" can be used to distinguish any one element with another element. However, the first element and the second element can be arbitrary named according to the convenience of those skilled in the art without departing the technical sprit of the present invention.

The terms used in the specification of the present invention are merely used in order to describe particular embodiments, and are not intended to limit the scope of the present invention. For example, an element described in the singular form is intended to include a plurality of elements unless the context clearly indicates otherwise. In addition, in the specification of the present invention, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

EMBODIMENTS

Figure 2:
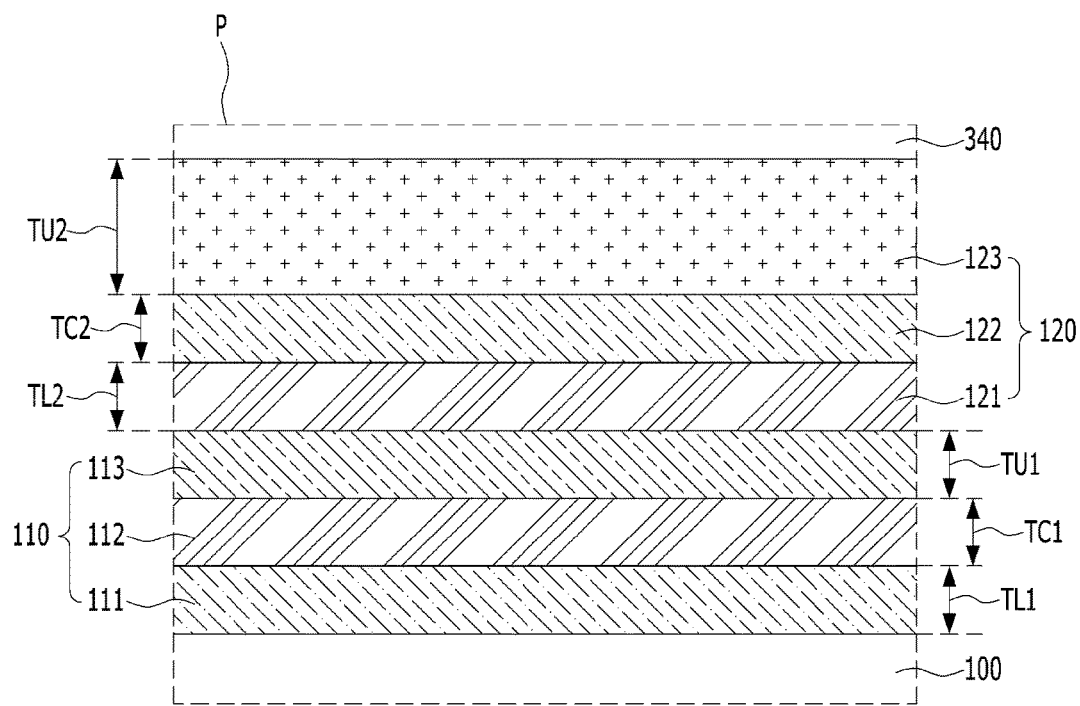
FIG. 2 is an enlarged view of region P in FIG. 1.

FIG. 1 is a view schematically showing a display apparatus according to an embodiment of the present invention. FIG. 2 is an enlarged view of region P in FIG. 1. All the components of the display apparatus according to all embodiments of the present invention are operatively coupled and configured.

Referring to FIGS. 1 and 2, the display apparatus according to the embodiment of the present invention can include a device substrate 100. The device substrate 100 can include an insulating material. The device substrate 100 can include a transparent material. For example, the device substrate 100 can be a glass substrate.

A light-emitting device 500 can be disposed on the device substrate 100. The light-emitting device 500 can emit light displaying a specific color. For example, the light-emitting device 500 can include a first electrode 510, a light-emitting layer 520 and a second electrode 530, which are sequentially stacked.

The first electrode 510 can include a conductive material. The first electrode 510 can include a transparent material. For example, the first electrode 510 can be a transparent electrode formed of a transparent conductive material, such as ITO and IZO.

An edge of the first electrode 510 can be covered by a bank insulating layer 150. The light-emitting layer 520 and the second electrode 530 can be stacked on a portion of the first electrode 510 which is exposed by the bank insulating layer 150. Thus, in the display apparatus according to the embodiment of the present invention, the plurality of the light-emitting devices 500 which are disposed on the device substrate 100 can be insulated by the bank insulating layer 150, each other.

The light-emitting layer 520 can generate light having luminance corresponding to a voltage difference between the first electrode 510 and the second electrode 530. For example, the light-emitting layer 520 can include an emission material layer (EML) having an emission material. The emission material can be an organic material, an inorganic material or a hybrid material. For example, the display apparatus according to the embodiment of the present invention can be an organic light-emitting display apparatus including the light-emitting layer 520 formed of an organic material.

The light-emitting layer 520 can have a multi-layer structure in order to increase luminous efficacy. For example, the light-emitting layer 520 can further include at least one of a hole injection layer (HIL), a hole transporting layer (HTL), an electron transporting layer (ETL) and an electron injection layer (EIL).

The second electrode 530 can include a conductive material. The second electrode 530 can include a material different from the first electrode 510. For example, the second electrode 530 can include a metal having high reflectance, such as aluminum (Al) and silver (Ag). Thus, in the display apparatus according to the embodiment of the present invention, the light generated by the light-emitting layer 520 can be emitted to outside through the first electrode 510 and the device substrate 100.

A driving circuit can be disposed between the device substrate 100 and the light-emitting device 500. The driving circuit can supply a driving current to the light-emitting device 500. The driving circuit can include at least one thin film transistor 300 and a storage capacitor. For example, the driving circuit can include the thin film transistor 300 which is electrically connected to the first electrode 510 of the light-emitting device 500.

The thin film transistor 300 can generate the driving current according to a gate signal and a data signal. For example, the thin film transistor 300 can include a semiconductor pattern 310, a gate insulating layer 320, a gate electrode 330, an interlayer insulating layer 340, a source electrode 350 and a drain electrode 360. The light-emitting device 500 can be connected to the drain electrode 360 of the corresponding thin film transistor 300.

The semiconductor pattern 310 can be disposed close to the device substrate 100. The semiconductor pattern 310 can include a semiconductor material. For example, the semiconductor pattern 310 can include amorphous silicon or poly-crystal silicon. The semiconductor pattern 310 can be oxide semiconductor. For example, the semiconductor pattern 310 can include IGZO.

The semiconductor pattern 310 can include a source region, a drain region and a channel region. The channel region can be disposed between the source region and the drain region. The channel region can have the conductivity lower than the source region and the drain region. For example, the source region and the drain region can have the concentration of a conductive impurity higher than the channel region.

The gate insulating layer 320 can be disposed on the semiconductor pattern 310. An upper surface of the semiconductor pattern 310 opposite to the device substrate 100 can be partially covered by the gate insulating layer 320. For example, the gate insulating layer 320 can overlap the channel region of the semiconductor pattern 310. The source region and the drain region of the semiconductor pattern 310 can be exposed by the gate insulating layer 320.

The gate insulating layer 320 can include an insulating material. For example, the gate insulating layer 320 can include silicon oxide and/or silicon nitride. The gate insulating layer 320 can include a High-K material. For example, the gate insulating layer 320 can include hafnium oxide (HfO) or titanium oxide (TiO). The gate insulating layer 320 can have a multi-layer structure.

The gate electrode 330 can be disposed on the gate insulating layer 320. The gate electrode 330 can be insulated from the semiconductor pattern 310 by the gate insulating layer 320. For example, the gate electrode 330 can overlap the channel region of the semiconductor pattern 310.

The gate electrode 330 can include a conductive material. For example, the gate electrode 330 can include a metal, such as aluminum (Al), chrome (Cr), molybdenum (Mo) and tungsten (W).

The interlayer insulating layer 340 can be disposed on the semiconductor pattern 310 and the gate electrode 330. The interlayer insulating layer 340 can be extended beyond the semiconductor pattern 310. For example, a side surface of the semiconductor pattern 310 and a side surface of the gate electrode 330 can be covered by the interlayer insulating layer 340.

The interlayer insulating layer 340 can include an insulating material. The refractive index of the interlayer insulating layer 340 can be the same as the refractive index of the device substrate 100. For example, the interlayer insulating layer 340 can include silicon oxide.

The source electrode 350 and the drain electrode 360 can be disposed on the interlayer insulating layer 340. The source electrode 350 can be electrically connected to the source region of the semiconductor pattern 310. The drain electrode 360 can be electrically connected to the drain region of the semiconductor pattern 310. The drain electrode 360 can be spaced away from the source electrode 350. For example, the interlayer insulating layer 340 can include a contact hole exposing the source region of the semiconductor pattern 310, and a contact hole exposing the drain region of the semiconductor pattern 310.

The source electrode 350 and the drain electrode 360 can include a conductive material. For example, the source electrode 350 and the drain electrode 360 can include a metal, such as aluminum (Al), chrome (Cr), molybdenum (Mo) and tungsten (W). The drain electrode 360 can include the same material as the source electrode 350. The gate electrode 330 can include a material different from the source electrode 350 and the drain electrode 360.

The driving circuit may not overlap the portion of the first electrode 510 exposed by the bank insulation layer 150. For example, the thin film transistor 300 can overlap the bank insulating layer 150. Thus, in the display apparatus according to the embodiment of the present invention, the light emitted from the light-emitting device 500 can be not blocked by the thin film transistor 300.

A buffer insulating layer can be disposed between the device substrate 100 and the thin film transistor 300. The buffer insulating layer can prevent the quality deterioration due to the device substrate 100 in the process of forming the thin film transistor 300 and the process of forming the light-emitting device 500. The buffer insulating layer can have a multi-layer structure. For example, the buffer insulating layer can include a first buffer insulating layer 110 and a second buffer insulating layer 120, which are sequentially stacked.

The buffer insulating layer can be disposed on the device substrate 100. The buffer insulating layer can prevent the quality deterioration due to the device substrate 100 in subsequent process. The buffer insulating layer can have a multi-layer structure. For example, the buffer insulating layer can have a stacked structure in which a first buffer insulating layer 110 and a second buffer insulating layer 120 are stacked.

The first buffer insulating layer 110 can be disposed close to the device substrate 100. For example, the first buffer insulating layer 110 can be disposed between the device substrate 100 and the second buffer insulating layer 120.

The refractive index of the first buffer insulating layer 110 can increase in a direction away from the device substrate 100. The first buffer insulating layer 110 can include first buffer layers 111, 112 and 113 having different refractive index. For example, the first buffer insulating layer 110 can include a first lowest buffer layer 111, a first intermediate buffer layer 112 and a first highest buffer layer 113, which are sequentially stacked on the device substrate 100. The refractive index of the first highest buffer layer 113 can be larger than the refractive index of the first lowest buffer layer 111. The refractive index of the first intermediate buffer layer 112 can be between the refractive index of the first lowest buffer layer 111 and the refractive index of the first highest buffer layer 113. Also, the refractive index of the first lowest buffer layer 111 is larger than the refractive index of the device substrate 100.

The first buffer layers 111, 112 and 113 can include an insulating material. At least one of the first buffer layers 111, 112 and 113 can include a different material. For example, the first lowest buffer layer 111 and the first intermediate buffer layer 112 can include silicon oxide nitride (SiON), and the first highest buffer layer 113 can include silicon nitride (SiN).

The first buffer layers 111, 112 and 113 can have the same thickness. For example, the thickness TC1 of the first intermediate buffer layer 112 can be the same as the thickness TL1 of the first lowest buffer layer 111. The thickness TU1 of the first highest buffer layer 113 can be the same as the thickness TC1 of the first intermediate buffer layer 112.

The second buffer insulating layer 120 can be disposed on the first buffer insulating layer 110. For example, the second buffer insulating layer 120 can be disposed between the first buffer insulating layer 110 and the light-emitting device 500. The second buffer insulating layer 120 can be in direct contact with an upper surface of the first buffer insulating layer 110 opposite to the device substrate 100. The upper surface of the first buffer insulating layer 110 can be an interface between the first buffer insulating layer 110 and the second buffer insulating layer 120.

The refractive index of the second buffer insulating layer 120 can decrease in a direction away from the first buffer insulating layer 110. Thus, in the display apparatus according to the embodiment of the present invention, the steep change of the refractive index in a path of the light emitted from the light-emitting device 500 can be prevented. The second buffer insulating layer 120 can include second buffer layers 121, 122 and 123 having the different refractive index. For example, the second buffer insulating layer 120 can include a second lowest buffer layer 121, a second intermediate buffer layer 122 and a second highest buffer layer 123, which are sequentially stacked on the first buffer insulating layer 110. The refractive index of the second highest buffer layer 123 can be smaller than the refractive index of the second lowest buffer layer 121. The refractive index of the second intermediate buffer layer 122 can be between the refractive index of the second lowest buffer layer 121 and the refractive index of the second highest buffer layer 123.

The second buffer layers 121, 122 and 123 can include an insulating material. At least one of the second buffer layers 121, 122 and 123 can include a different material. For example, the second lowest buffer layer 121 and the second intermediate buffer layer 122 can include silicon oxide nitride (SiON), and the second highest buffer layer 123 can include silicon oxide (SiO).

The variation of the refractive index between the second buffer layers 121, 122 and 123 can be different from the variation of the refractive index between the first buffer layers 111, 112 and 113 with respect to the interface between the first buffer insulating layer 110 and the second buffer insulating layer 120. For example, the refractive index of the second lowest buffer layer 121 can be smaller than the refractive index of the first highest buffer layer 113. The refractive index of the second intermediate buffer layer 122 can be smaller than the refractive index of the first intermediate buffer layer 112. The refractive index of the second highest buffer layer 123 can be smaller than the refractive index of the first lowest buffer layer 111.

The first buffer layers 111, 112 and 113 and the second buffer layers 121, 122 and 123 can have the refractive index symmetrical with respect to the first highest buffer layer 113. For example, the refractive index of the second lowest buffer layer 121 can be the same as the refractive index of the first intermediate buffer layer 112. The thickness TL2 of the second lowest buffer layer 121 can be the same as the thickness TC1 of the first intermediate buffer layer 112. The refractive index of the second intermediate buffer layer 122 can be the same as the refractive index of the first lowest buffer layer 111. The thickness TC2 of the second intermediate buffer layer 122 can be the same as the thickness TL1 of the first lowest buffer layer 111. The refractive index of the second highest buffer layer 123 can be the same as the refractive index of the device substrate 100. The thickness TU2 of the second highest buffer layer 123 can be larger than the thickness TC2 of the second intermediate buffer layer 122.

A light-blocking pattern 200 can be disposed between the device substrate 100 and the first buffer insulating layer 110. The light-blocking pattern 200 can block the light incident from the outside. For example, the semiconductor pattern 310 of the thin film transistor 300 can overlap the light-blocking pattern 200. A horizontal width of the light-blocking pattern 200 can be larger than a horizontal width of the semiconductor pattern 310. Thus, in the display apparatus according to the embodiment of the present invention, an external light toward the channel region of the semiconductor pattern 310 can be blocked by the light-blocking pattern 200. Therefore, in the display apparatus according to the embodiment of the present invention, the malfunction of the thin film transistor 300 due to the external light can be prevented.

The light-blocking pattern 200 can have a multi-layer structure. For example, the light-blocking pattern 200 can include a low-reflective layer 210 and the light-blocking layer 220, which are sequentially stacked on the device substrate 100. The low-reflective layer 210 can include a low-reflective material. For example, the low-reflective layer 210 can include a low-reflective metal, such as molybdenum (Mo), chrome (Cr), titanium (Ti) and tantalum (Ta). The light-blocking layer 220 can include a conductive material. The reflectance of the light-blocking layer 220 can be larger than the reflectance of the low-reflective layer 210. For example, the light-blocking layer 220 can include a metal, such as aluminum (Al) and silver (Ag). Thus, in the display apparatus according to the embodiment of the present invention, the visibility deterioration due to the light reflected by the light-blocking layer 220 can be prevented.

The light-blocking pattern 200 can be electrically connected to the driving circuit. For example, the drain electrode 360 of the thin film transistor 300 can be connected to the light-blocking layer 220 of the light-blocking pattern 200. The first buffer insulating layer 110 and the second buffer insulating layer 120 can include a contact hole exposing a portion of the light-blocking layer 220. Thus, in the display apparatus according to the embodiment of the present invention, the parasitic capacitance due to the light-blocking pattern 200 can be prevented.

A lower passivation layer 130 can be disposed on an upper surface of the thin film transistor 300 opposite to the device substrate 100. The lower passivation layer 130 can prevent the damage of the thin film transistor 300 due to the external impact and moisture. For example, the lower passivation layer 130 can be extended beyond the source electrode 350 and the drain electrode 360. The thin film transistor 300 can be covered by the lower passivation layer 130, substantially.

The lower passivation layer 130 can include an insulating material. The lower passivation layer 130 can be direct contact with the interlayer insulating layer 340 on the outside of the source electrode 350 and the drain electrode 360. The lower passivation layer 130 can include the same material as the interlayer insulating layer 340. For example, the lower passivation layer 130 can include silicon oxide.

An over-coat layer 140 can be disposed between the lower passivation layer 130 and the light-emitting device 500, and between the lower passivation layer 130 and the bank insulating layer 150. The over-coat layer 140 can remove a thickness difference due to the light-blocking pattern 200 and the thin film transistor 300. For example, an upper surface of the over-coat layer 140 opposite to the device substrate 100 can be a flat surface.

The over-coat layer 140 can include an insulating material. The over-coat layer 140 can include a relative fluid material. For example, the over-coat layer 140 can include an organic insulating material.

A color filter 400 can be disposed on the path of the light emitted from the light-emitting device 500. For example, the color filter 400 can be disposed between the lower passivation layer 130 and the over-coat layer 140. A thickness difference due to the color filter 400 can be removed by the over-coat layer 140.

The color realized by the light which is emitted from the light-emitting device can be changed by the color filter 400. For example, the light which is emitted from the light-emitting device 500 and displays white color can realize blue color, red color or green color by the color filter 400. The color filter 400 can overlap the portion of the first electrode 510 exposed by the bank insulating layer 150. The color filter 400 may not overlap the thin film transistor 300. A horizontal width of the color filter 400 can be larger than a horizontal width of the portion of the first electrode 510 exposed by the bank insulating layer 150. Thus, in the display apparatus according to the embodiment of the present invention, all of the light emitted from the light-emitting device 500 can pass through the color filter 400. Therefore, in the display apparatus according to the embodiment of the present invention, the light leakage can be prevented.

An encapsulating layer 600 can be disposed on the second electrode 530 of the light-emitting device 500. The encapsulating layer 600 can prevent the damage of the light-emitting device 500 due to the external impact and moisture. For example, the encapsulating layer 600 can completely cover the light-emitting devices 500 which are disposed on the device substrate 100. The encapsulating layer 600 can include moisture-absorbing beads formed of a moisture-absorbing material. The encapsulating layer 600 can have a multi-layer structure. For example, the encapsulating layer 600 can include a lower encapsulating layer and an upper encapsulating layer, which are sequentially stacked on the light-emitting device 500. The moisture-absorbing beads can be dispersed in the upper encapsulating layer. The lower encapsulating layer can be disposed between the light-emitting device 500 and the upper encapsulating layer. Thus, in the display apparatus according to the embodiment of the present invention, the stress applied to the light-emitting device 500 due to expansion of the moisture-absorbing beads can be relieved by the lower encapsulating layer.

The encapsulating layer 600 can include an insulating material. The encapsulating layer 600 can include a material which does not need a curing process. For example, the encapsulating layer 600 can include an olefin-based material. Thus, in the display apparatus according to the embodiment of the present invention, the deterioration of the light-emitting device 500 due to the process of forming the encapsulating layer 600 can be prevented. The lower encapsulating layer can include a material different from the upper encapsulating layer.

The display apparatus according to the embodiment of the present invention is described that the encapsulating layer 600 is in direct contact with the light-emitting device 500. However, the display apparatus according to another embodiment of the present invention can further include an upper passivation layer between the second electrode 530 of the light-emitting device 500 and the encapsulating layer 600. The upper passivation layer can prevent the damage of the light-emitting device 500 due to the external impact and moisture. The upper passivation layer can include an insulating material. The upper passivation layer can have a multi-layer structure. The upper passivation layer can include a material different from the encapsulating layer 600. For example, the upper passivation layer can have a structure in which an organic insulating layer formed of an organic material is disposed between inorganic insulating layers which are formed of an inorganic material. Thus, in the display apparatus according to another embodiment of the present invention, the damage of the light-emitting device 500 due to the external impact and moisture can be efficiently prevented.

An encapsulation substrate 700 can be disposed on the encapsulating layer 600. The encapsulation substrate 700 can be coupled with the device substrate 100 on which the light-emitting device 500 is formed, by the encapsulating layer 600. The encapsulation substrate 700 can include a material different from the device substrate 100. The encapsulating substrate 700 can dissipate heat generated by the light-emitting device 500 and/or the thin film transistor 300 in the operation of realizing the image. For example, the encapsulation substrate 700 can include a metal having a relatively high thermal conductivity, such as aluminum (Al).

Accordingly, the display apparatus according to the embodiment of the present invention can include the first buffer insulating layer 110 and the second buffer insulating layer 120 which are stacked between the device substrate 100 and the light-emitting device 500. The first buffer insulating layer 110 can have the refractive index decreasing in a direction away from the light-emitting device 500. The second buffer insulating layer 120 can have the refractive index increasing in the direction away from the light-emitting device 500. Thus, in the display apparatus according to the embodiment of the present invention, the difference of the refractive index between insulating layers which are stacked on the path of the light emitted to the outside through the device substrate 100 can be minimized. Therefore, in the display apparatus according to the embodiment of the present invent, the steep change of the refractive index between the buffer insulating layer and the peripheral element can be prevented. Thereby, in the display apparatus according to the embodiment of the present invention, the unintended reflection due to the buffer insulating layer can be prevented.

Figure 3:
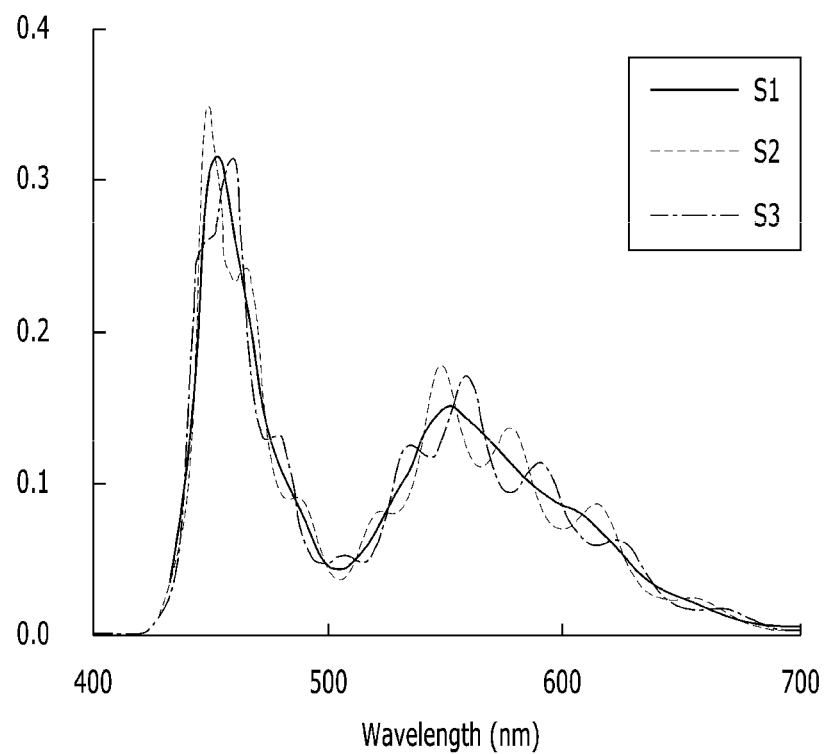
FIG. 3 is a graph displaying the spectrum of a light emitted from a light-emitting device according to the distribution of the refractive index in a buffer insulating layer which is disposed between a device substrate and the light-emitting device.

FIG. 3 is a graph displaying the spectrum of the light emitted from the light-emitting device 500 according to the distribution of the refractive index in the buffer insulating layer which is disposed between the device substrate 100 and the light-emitting device 500. Herein, S1 is a graph displaying the spectrum of the display apparatus according to the embodiment of the present invention. Further, S2 is a graph displaying the spectrum of the display apparatus including the buffer insulating layer which has the refractive index decreasing in a direction toward the light-emitting device from the device substrate. Furthermore, S3 is a graph displaying the spectrum of the display apparatus including the buffer insulating layer which has the refractive index increasing in a direction toward the light-emitting device from the device substrate.

Referring to FIG. 3, the graph wiggling of S1 is smaller than the graph wiggling of S2 and S3. For example, the display apparatus according to the embodiment of the present invention can prevent the unintended constructive and destructive interference of the light emitted from the light-emitting device 500 by the stacked structure of the first buffer insulating layer 110 and the second buffer insulating layer 120, which have the refractive index decreasing in a direction away from the interface between the first buffer insulating layer 110 and the second buffer insulating layer 120. Thus, in the display apparatus according to the embodiment of the present invention, the characteristics distribution of the light according to the position can be prevented. Therefore, in the display apparatus according to the embodiment of the present invention, the luminous efficacy can be increased, and the variation of color coordinates can be prevented.

Figure 4:
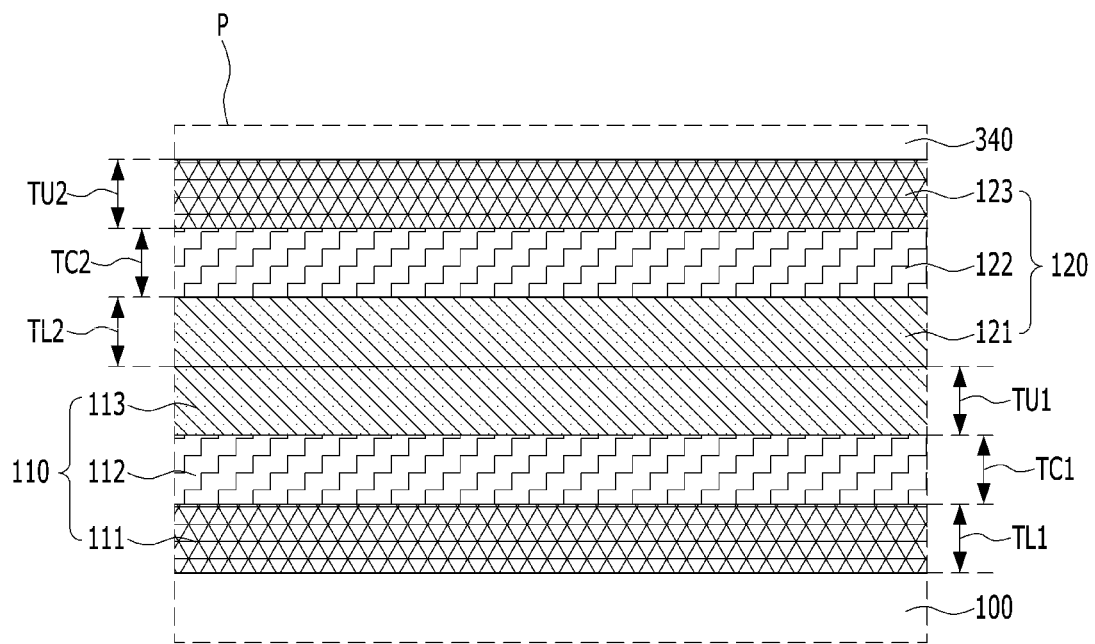
FIGS. 4 to 7 are views respectively showing a display apparatus according to another embodiment of the present invention.

The display apparatus according to the embodiment of the present invention is described that the second lowest buffer layer 121 of the second buffer insulating layer 120 has the refractive index smaller than the first highest buffer layer 113 of the first buffer insulating layer 110. However, in the display apparatus according to another embodiment of the present invention, the variation of the refractive index between the second buffer layers 121, 122 and 123 can be symmetrical with the variation of the refractive index between the first buffer layers 111, 112 and 113 with respect to the interface between the first buffer insulating layer 110 and the second buffer insulating layer 120. For example, in the display apparatus according to another embodiment of the present invention, the refractive index of the second lowest buffer layer 121, the second intermediate buffer layer 122 and the second highest buffer layer 123 of the second buffer insulating layer 120 can be the same as the refractive index of the first highest buffer layer 113, the first intermediate buffer layer 112 and the first lowest buffer layer 111 of the first buffer insulating layer 110, respectively. Thus, in the display apparatus according to another embodiment of the present invention, the thickness TU2 of the second highest buffer layer 123 can be the same as the thickness TL1 of the first lowest buffer layer 111, the thickness TC2 of the second intermediate buffer layer 122 can be the same as the thickness TC1 of the first intermediate buffer layer 112, and the thickness TL2 of the second lowest buffer layer 121 can be the same as the thickness TU1 of the first highest buffer layer 113, as shown in FIG. 4. Therefore, in the display apparatus according to another embodiment of the present invention, the wiggling of the spectrum can be minimized, and the quality deterioration due to the device substrate 100 can be efficiently prevented.

Figure 5:
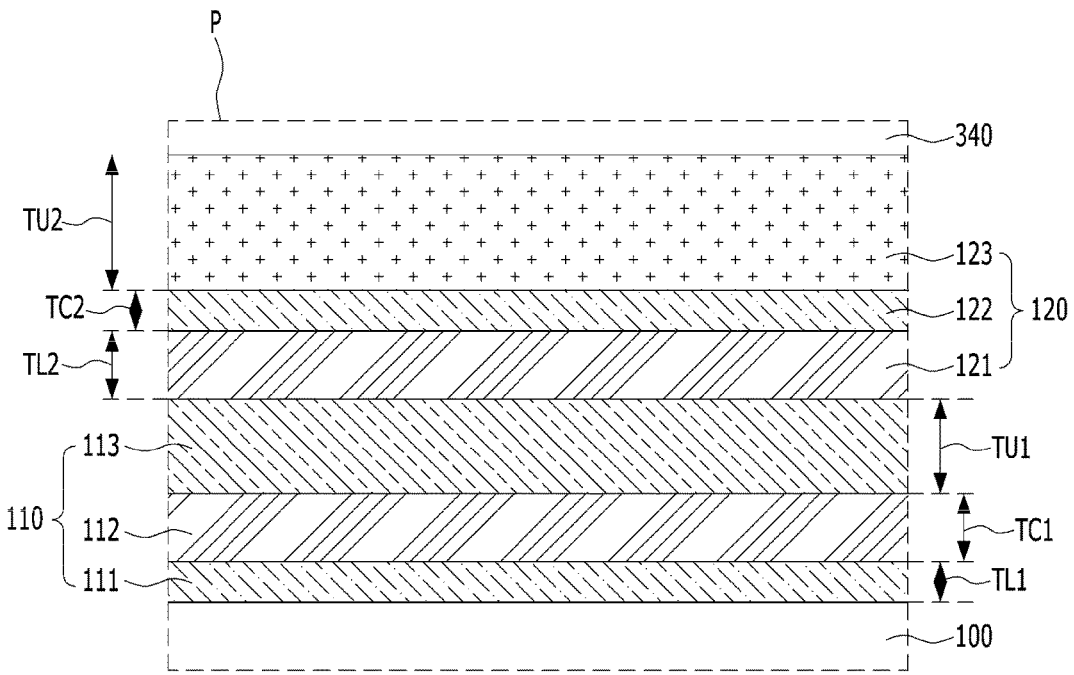

The display apparatus according to the embodiment of the present invention is described that the first buffer layers 111, 112 and 113 have the same thickness (TL1=TC1=TU1). However, in the display apparatus according to another embodiment of the present invention, the first buffer layers 111, 112 and 113 have the different thickness, each other. For example, in the display apparatus according to another embodiment of the present invention, the thickness TL1 of the first lowest buffer layer 111 can be smaller than the thickness TU1 of the first highest buffer layer 113, the thickness TC1 of the first intermediate buffer layer 112 can be between the thickness TL1 of the first lowest buffer layer 111 and the thickness TU1 of the first highest buffer layer 113, as shown in FIG. 5. Also, in the display apparatus according to another embodiment of the present invention, the second buffer layers 121, 122 and 123 can have the thickness corresponding to the first buffer layers 111, 112 and 113. Thus, in the display apparatus according to another embodiment of the present invention, the degree of freedom in the configuration of the buffer insulating layer can be improved.

Figure 6:
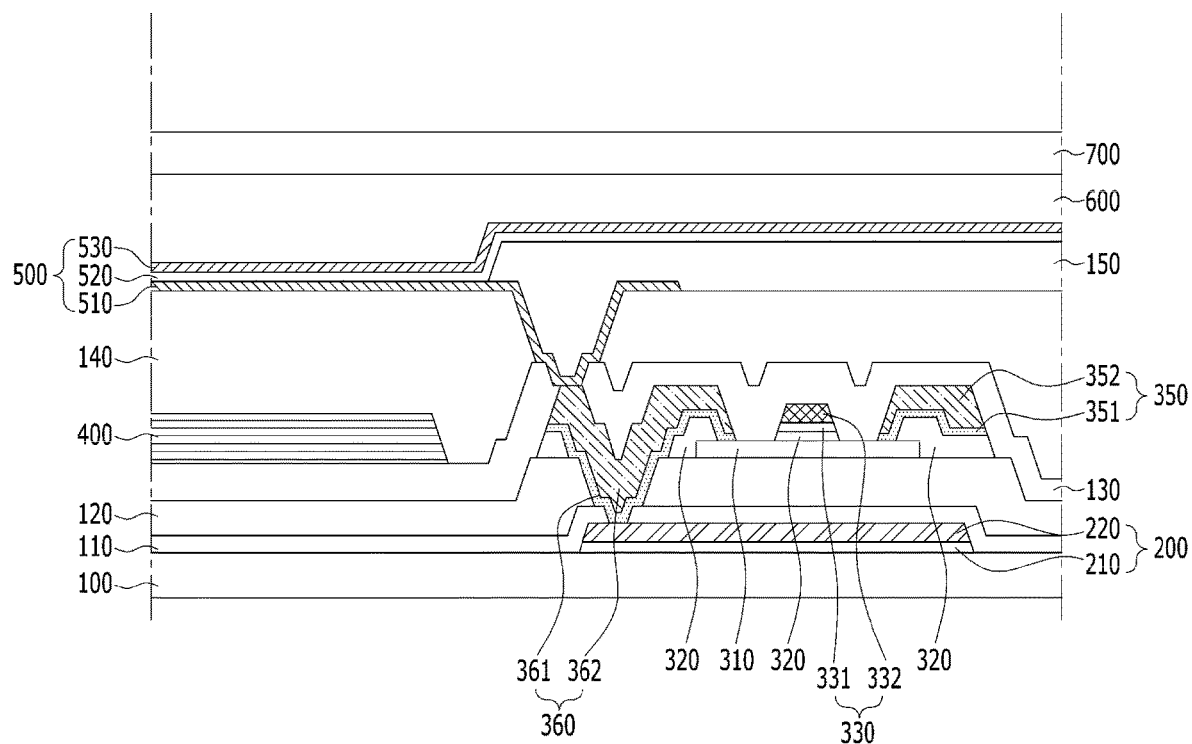

The display apparatus according to the embodiment of the present invention is described that the gate electrode 330, the source electrode 350 and the drain electrode 360 of the thin film transistor 300 have a single layer structure. However, in the display apparatus according to another embodiment of the present invention, the thin film transistor 300 can include the gate electrode 330, the source electrode 350 and the drain electrode 360 which have a multi-layer structure, as shown in FIG. 6. For example, the gate electrode 330 can include a lower gate layer 331 and an upper gate layer 332, the source electrode 350 can include a lower source layer 351 and an upper source layer 352, and the drain electrode 360 can include a lower drain layer 361 and an upper drain layer 362. The lower gate layer 331, the lower source layer 351 and the lower drain layer 361 can include a low-reflective material. For example, the lower gate layer 331, the lower source layer 351 and the lower drain layer 361 can include a low-reflective metal, such as molybdenum (Mo), chrome (Cr), titanium (Ti) and tantalum (Ta). The upper gate layer 332, the upper source layer 352 and the upper drain layer 362 can have the conductivity higher than the lower gate layer 331, the lower source layer 351 and the lower drain layer 361, respectively.

The display apparatus according to the embodiment of the present invention is described that the interlayer insulating layer 340 of the thin film transistor 300 is extended between the second buffer insulating layer 120 and the lower passivation layer 130. However, in the display apparatus according to another embodiment of the present invention, the lower passivation layer 130 can be in direct contact with the second buffer insulating layer 120 between the device substrate 100 and the color filter 400, as shown in FIG. 6. For example, in the display apparatus according to another embodiment of the present invention, a portion of the interlayer insulating layer 340 can be removed by using a mask in the process of forming the source electrode 350 and the drain electrode 360. Thus, in the display apparatus according to another embodiment of the present invention, the degree of freedom in a material of the interlayer insulating layer 340 can be improved. For example, in the display apparatus according to another embodiment of the present invention, the refractive index of the interlayer insulating layer 340 can be very different from the refractive index of the lower passivation layer 130. Thus, in the display apparatus according to another embodiment of the present invention, the function of the interlayer insulating layer 340 can be sufficiently performed, and the variation of the color coordinates can be prevented.

Figure 7:
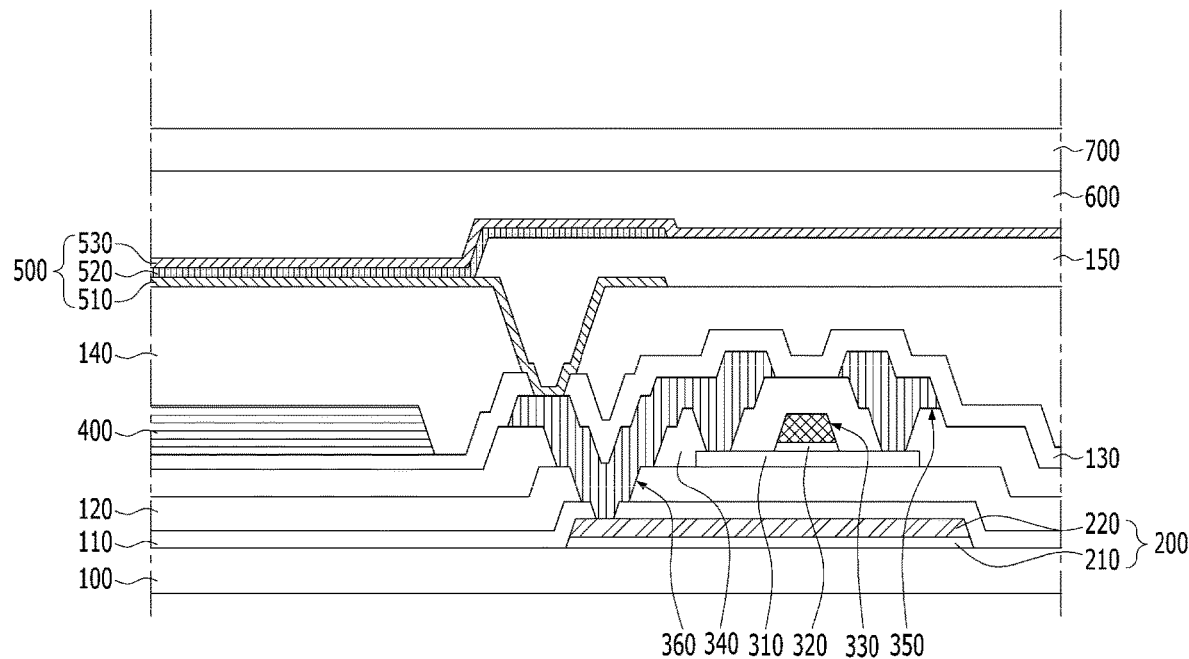

The display apparatus according to the embodiment of the present invention is described that the light-emitting layer 520 and the second electrode 530 of the light-emitting device 500 can be extended onto the bank insulating layer 150. For instance, in the display apparatus according to the embodiment of the present invention, the light-emitting layer 520 of each light-emitting device 500 can be connected to the light-emitting layer 520 of adjacent light-emitting device 500. However, in the display apparatus according to another embodiment of the present invention, each of the light-emitting devices 500 can include the light-emitting layer 520 separated from adjacent light-emitting device 500, as shown in FIG. 7. For example, in the display apparatus according to another embodiment of the present invention, the light-emitting device 500 disposed on a blue sub-pixel can include a blue light-emitting layer 520, the light-emitting device 500 disposed on a green sub-pixel can include a green light-emitting layer 520, and the light-emitting device 500 disposed on a red sub-pixel can include a red light-emitting layer 520.

Figure 8:
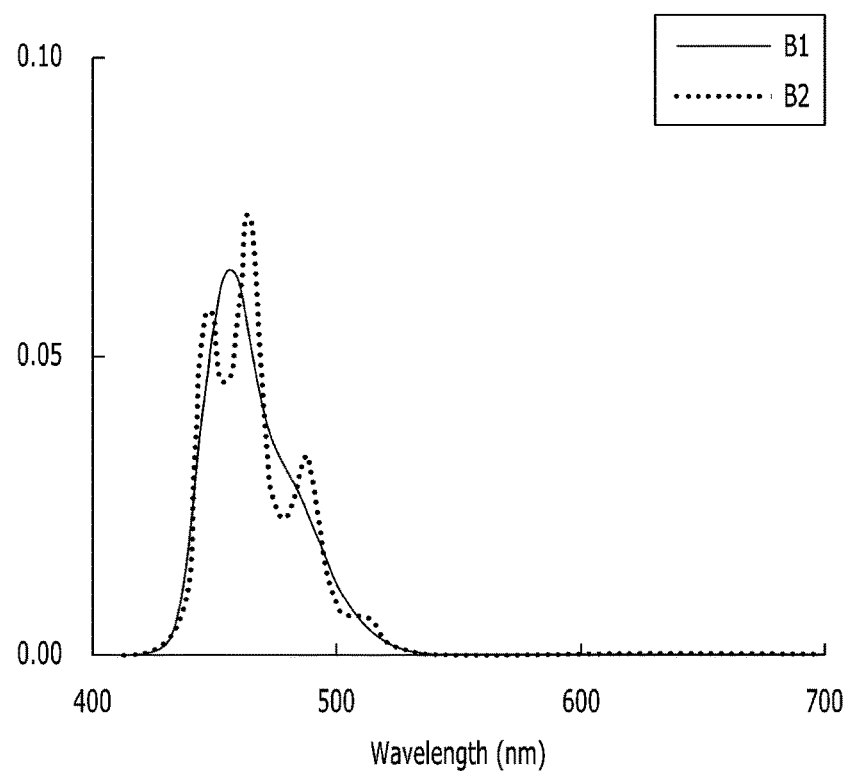
FIGS. 8 to 10 are graphs respectively displaying the spectrum of the light emitted from the light-emitting device in the blue, green or red sub-pixel according to the presence or absence of stacking a first buffer insulating layer and a second buffer insulating layer between the device substrate and the light-emitting device.
Figure 9:
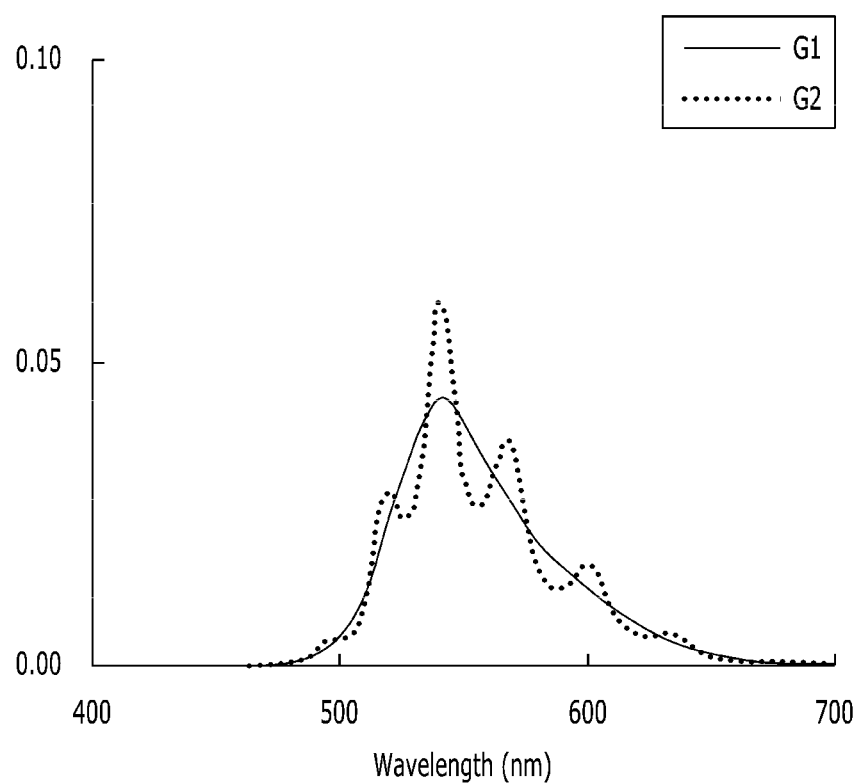
Figure 10:
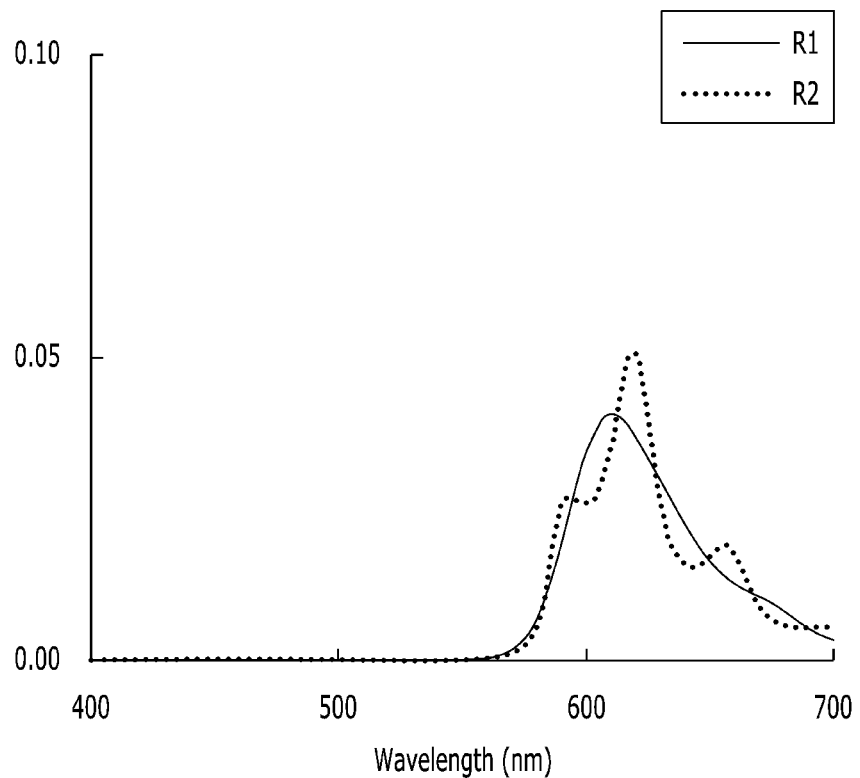

FIG. 8 is a graph displaying the spectrum of the light emitted from the light-emitting device on the blue sub-pixel according to the presence or absence of stacking the first buffer insulating layer and the second buffer insulating layer between the device substrate and the light-emitting device. FIG. 9 is a graph displaying the spectrum of the light emitted from the light-emitting device on the green sub-pixel according to the presence or absence of stacking the first buffer insulating layer and the second buffer insulating layer between the device substrate and the light-emitting device. FIG. 10 is a graph displaying the spectrum of the light emitted from the light-emitting device on the red sub-pixel according to the presence or absence of stacking the first buffer insulating layer and the second buffer insulating layer between the device substrate and the light-emitting device.

Referring to FIGS. 9-10, the display apparatus B1, G1 and R1 including the first buffer insulating layer and the second buffer insulating layer which are stacked between the device substrate and the light-emitting device of the blue, green or red sub-pixel can have the wiggling of the graph smaller than the display apparatus B2, G2 and R2 including the buffer insulating layer having the specific refractive index. For instance in the display apparatus according to another embodiment of the present invention, the luminous efficacy of the light-emitting device having the light-emitting layer separated from adjacent light-emitting device can be increased, and the variation of the color coordinates due to constructive/destructive interference between the reflected lights can be prevented. For example, in the display apparatus according to another embodiment of the present invention, the color coordinates can be optimized by adjusting the stacked structure of the first buffer insulating layer and the second buffer insulating layer of the display device. Thus, in the display apparatus according to another embodiment of the present invention, the quality of the realized image can be improved.

As a result, the display apparatus according to the embodiments of the present invention can prevent the steep change of the refractive index due to the buffer insulating layer which is disposed between the device substrate and the light-emitting device. Thus, in the display apparatus according to the embodiments of the present invention, the light emitted from the light-emitting device may not be reflected by the difference of the refractive index between adjacent insulating layers. That is, in the display apparatus according to the embodiments of the present invention, the unintended constructive and destructive interference of the light can be prevented. Therefore, in the display apparatus according to the embodiments of the present invention, the luminous efficacy can be increased, and the variation of color coordinates can be prevented.

What is claimed is:

1. A display device comprising:
    a first buffer insulating layer on a device substrate, the first buffer insulating layer including a first lowest buffer layer, a first intermediate buffer layer and a first highest buffer layer, which are sequentially stacked on the device substrate;
    a second buffer insulating layer on the first buffer insulating layer, the second buffer insulating layer including a second lowest buffer layer, a second intermediate buffer layer and a second highest buffer layer, which are sequentially stacked on the first buffer insulating layer; and
    a light-emitting device on the second buffer insulating layer,
    wherein the second lowest buffer layer is in contact with the first highest buffer layer,
    wherein a refractive index of the first lowest buffer layer is lower than a refractive index of the first highest buffer layer, and a refractive index of the first intermediate buffer layer is between the refractive index of the first lowest buffer layer and the refractive index of the first highest buffer layer, and
    wherein a refractive index of the second intermediate buffer layer is lower than a refractive index of the second lower buffer layer, and a refractive index of the second highest buffer layer is lower than the refractive index of the second intermediate buffer layer.

2. The display device according to claim 1, further comprising a color filter between the second buffer insulating layer and the light-emitting device.

3. The display device according to claim 1, wherein the refractive index of the first lowest buffer layer is larger than a refractive index of the device substrate.

4. The display device according to claim 1, wherein the first lowest buffer, the first intermediate buffer layer and the first highest buffer layer have the same thickness.

5. The display device according to claim 1,
    wherein the refractive index of the second lowest buffer layer is smaller than the refractive index of the first highest buffer layer.

6. The display device according to claim 5, wherein the refractive index of the second lowest buffer layer is the same as the refractive index of the first intermediate buffer layer.

7. The display device according to claim 5, wherein the refractive index of the second intermediate buffer layer is the same as the refractive index of the first lowest buffer layer.

8. The display device according to claim 5, wherein the refractive index of the second highest buffer layer is the same as a refractive index of the device substrate.

9. The display device according to claim 5, wherein a refractive index of the device substrate is the same as the refractive index of the second highest buffer layer,
    the refractive index of the first lowest buffer layer is the same as the refractive index of the second intermediate buffer layer, and
    the refractive index of the first intermediate buffer layer is the same as the refractive index of the second lowest buffer layer.

10. The display device according to claim 9, wherein a thickness of the device substrate is the same as a thickness of the second highest buffer layer, a thickness of the first lowest buffer layer is the same as a thickness of the second intermediate buffer layer, and a thickness of the first intermediate buffer layer is the same as a thickness of the second lowest buffer layer.

11. The display device according to claim 5, wherein the refractive index of the first lowest buffer layer is the same as the refractive index of the second highest buffer layer, the refractive index of the first intermediate buffer layer is the same as the refractive index of the second intermediate buffer layer, and the refractive index of the first highest buffer layer is the same as the refractive index of the second lowest buffer layer.

12. The display device according to claim 11, wherein a thickness of the first lowest buffer layer is the same as a thickness of the second highest buffer layer, a thickness of the first intermediate buffer layer is the same as a thickness of the second intermediate buffer layer, and a thickness of the first highest buffer layer is the same as a thickness of the second lowest buffer layer.

13. The display device according to claim 5, wherein a thickness of the second highest buffer layer is larger than a thickness of the second intermediate buffer layer.

14. A display device comprising:

a light-emitting device including a first electrode, a second electrode and a light-emitting layer between the first electrode and the second electrode; and a buffer insulating layer including a first buffer insulating layer and a second buffer insulating layer, which are stacked on the first electrode of the light-emitting device, wherein the first buffer insulating layer includes a first highest buffer layer being disposed closest to the light-emitting device and first buffer layers having refractive indexes which are decreased from the first highest buffer layer in a direction away from the light-emitting device, and wherein the second buffer insulating layer includes a second highest buffer layer being disposed closest to the light-emitting device and second buffer layers having refractive indexes which are increased from the second highest buffer layer in a direction away from the light-emitting device.

15. The display device according to claim 14, wherein the second buffer insulating layer is in contact with the first buffer insulating layer.

16. The display device according to claim 14, wherein the number of the stacked second buffer layers is the same as the number of the stacked first buffer layers.

17. The display device according to claim 16, wherein each of the first buffer layers has the same thickness as the first highest buffer layer.

18. The display device according to claim 16, wherein a variation of the refractive index between the second buffer layers is symmetrical with a variation of the refractive index between the first buffer layers.

* * * * *